US010488547B2

(12) United States Patent
Wu

(10) Patent No.: US 10,488,547 B2
(45) Date of Patent: Nov. 26, 2019

(54) ESTIMATING SUBSURFACE FORMATION AND INVASION PROPERTIES

(71) Applicant: Halliburton Energy Services, Inc., Houston, TX (US)

(72) Inventor: Dagang Wu, Katy, TX (US)

(73) Assignee: Halliburton Energy Services, Inc., Houston, TX (US)

(*) Notice: Subject to any disclaimer, the term of this patent is extended or adjusted under 35 U.S.C. 154(b) by 0 days.

(21) Appl. No.: 15/420,800

(22) Filed: Jan. 31, 2017

(65) Prior Publication Data
US 2017/0235011 A1    Aug. 17, 2017

Related U.S. Application Data

(63) Continuation of application No. 14/785,380, filed as application No. PCT/US2014/033848 on Apr. 11, 2014, now abandoned.

(51) Int. Cl.
*G01V 3/38* (2006.01)
*G01R 35/00* (2006.01)
(Continued)

(52) U.S. Cl.
CPC ............. *G01V 3/38* (2013.01); *G01R 35/005* (2013.01); *E21B 49/00* (2013.01); *G01V 3/18* (2013.01); *G01V 3/20* (2013.01)

(58) Field of Classification Search
CPC ... G01V 3/14; G01V 3/38; G01V 1/50; E21B 49/00; E21B 47/00
See application file for complete search history.

(56) References Cited

U.S. PATENT DOCUMENTS 5,497,321 A * 3/1996 Ramakrishnan ...... E21B 47/102
702/12
7,091,877 B2    8/2006 Barber et al.
(Continued)

FOREIGN PATENT DOCUMENTS

EP          0930519 B1    10/2008
WO      2009039468 A1     3/2009

OTHER PUBLICATIONS

"European Application Serial No. 14877561.2, Extended European Search Report dated Feb. 10, 2016", 7 pgs.
(Continued)

Primary Examiner — Mohamed Charioui
Assistant Examiner — Christine Y Liao
(74) Attorney, Agent, or Firm — Gilliam IP PLLC

(57) ABSTRACT

An estimated value for invasion depth of an invasion zone in a subsurface measurement zone is calculated in a one-dimensional optimization procedure based on multi-array laterolog measurement data. A one-dimensional optimization problem is defined as having the invasion depth as a sole variable measurement zone parameter. The one-dimensional optimization problem is then solved by automated, iterative modification of the invasion depth value. The one-dimensional optimization problem can be a function to minimize a misfit error between (a) multi-array measurement values for resistivity of the subsurface measurement zone, and (b) predicted measurement values calculated in accordance with a simulated measurement zone model based at least in part on the invasion depth. In one embodiment, the optimization function defines a misfit error between (1) normalized differences between respective measurements of neighboring measurement arrays of the multi-array laterolog tool, and (2) normalized differences between respective predicted measurement values for neighboring measurement arrays.

28 Claims, 12 Drawing Sheets

(51) Int. Cl.
    *E21B 49/00*     (2006.01)
    *G01V 3/18*     (2006.01)
    *G01V 3/20*     (2006.01)

(56) References Cited

U.S. PATENT DOCUMENTS

| | | |
|---|---|---|
| 7,236,886 B2 | 6/2007 | Frenkel et al. |
| 8,775,084 B2 | 7/2014 | Rabinovich et al. |
| 2002/0040274 A1 | 4/2002 | Yin et al. |
| 2003/0004647 A1* | 1/2003 | Sinclair .................... G01V 3/28 |
| | | 702/7 |
| 2005/0075789 A1* | 4/2005 | Xiao ...................... G01V 11/00 |
| | | 702/6 |
| 2006/0173624 A1 | 8/2006 | Frenkel |
| 2009/0082969 A1 | 3/2009 | Rabinovich et al. |
| 2010/0126717 A1 | 5/2010 | Kuchuk et al. |
| 2012/0043966 A1 | 2/2012 | Montaron |
| 2013/0338925 A1 | 12/2013 | Yang et al. |
| 2016/0070019 A1 | 3/2016 | Wu |

OTHER PUBLICATIONS

"International Application Serial No. PCT/US2014/033848, International Search Report dated Jan. 9, 2015", 3 pgs.

"International Application Serial No. PCT/US2014/033848, Written Opinion dated Jan. 9, 2015", 4 pgs.

Bryan, "One-Dimensional Optimization", Rose-Hulman Institute of Technology, MA 348, Jan. 1, 2011 00:00:00.0, 1-8 pgs.

MX Application Serial No. MX/a/2016/011217, Office Action, dated Mar. 25, 2019, 5 pages.

\* cited by examiner

ESTIMATING SUBSURFACE FORMATION AND INVASION PROPERTIES

TECHNICAL FIELD

The present application relates generally to hydrocarbon exploration and production, and more specifically to the field of interpreting measurements made by well logging instruments for the purpose of determining Earth formation properties. Some embodiments relate particularly to methods and systems for determination of formation resistivity using multi-array resistivity measurement data.

BACKGROUND

Modern operations for the exploration and production of oil and gas rely on access to a variety of information regarding parameters and conditions encountered downhole. Such information typically includes characteristics of Earth formations traversed by a borehole, as well as data relating to the size and configuration of the borehole itself. The collection of information relating to subsurface conditions, which is commonly referred to as "logging," can be performed by several methods, including wireline logging and logging while drilling (LWD).

In wireline logging, a sonde is lowered into the borehole after some or all of the well has been drilled. The sonde hangs at the end of a wireline cable that provides mechanical support to the sonde and also provides an electrical connection between the sonde and electrical equipment located at the surface. In accordance with existing logging techniques, various parameters of the Earth's formations are measured and correlated with the position of the sonde in the borehole as the sonde is pulled uphole. In LWD, a drilling assembly includes sensing instruments that measure various parameters as the formation is penetrated, thereby enabling measurement of the formation during the drilling operation.

Among the available wireline and LWD tools are a variety of resistivity logging tools including multi-array laterolog tools. Such tools typically include a central electrode around a tool body, with guard electrodes spaced above and below the central electrode. The tool drives auxiliary currents between the guard electrodes and the central electrode to focus the current from the center electrode, i.e., to reduce dispersion of the current from the central electrode until after the current has been located some distance into the formation. Generally speaking, a greater depth of investigation can be achieved using more widely-spaced guard electrodes, but the vertical resolution of the measurements may suffer. Accordingly, existing tools employ multiple sets of guard electrodes at different spacings from the center electrode to enable multiple depths of investigation (DOI) without unduly sacrificing vertical resolution. In this context, depth of investigation refers to a depth parameter that extends radially relative to the longitudinal axis of the borehole. Multi-array laterolog tool systems thus offer multiple depths of investigation, which is particularly useful in borehole environments having significantly variable depthwise resistivity profiles.

Collected measurements from multi-array laterolog tool systems are often processed to determine overall measurement zone resistivity logs at multiple depths of investigation. These resistivity measurements typically indicate, however, overall resistivity in a subsurface zone surrounding the borehole, which does not necessarily correspond to the resistivity of an underlying geological formation through which the borehole extends, because the measured subsurface zone can include an invasion zone resulting from the drilling/exploration operation. Resistivity values for the measurement zone overall are often expressed as being dependent on three fundamental parameters, namely the true resistivity of the geological formation, the resistivity of the invasion zone, and the radial depth of the invasion zone. As a result, calculating the true values for these three parameters from a single measured value presents an ill-posed problem that calls for significant processing resources and that can be significantly sensitive to initial guessed values for at least some of the parameters.

BRIEF DESCRIPTION OF THE DRAWINGS

Some embodiments are illustrated by way of example and not limitation in the figures of the accompanying drawings in which.

DETAILED DESCRIPTION

Figure 1:
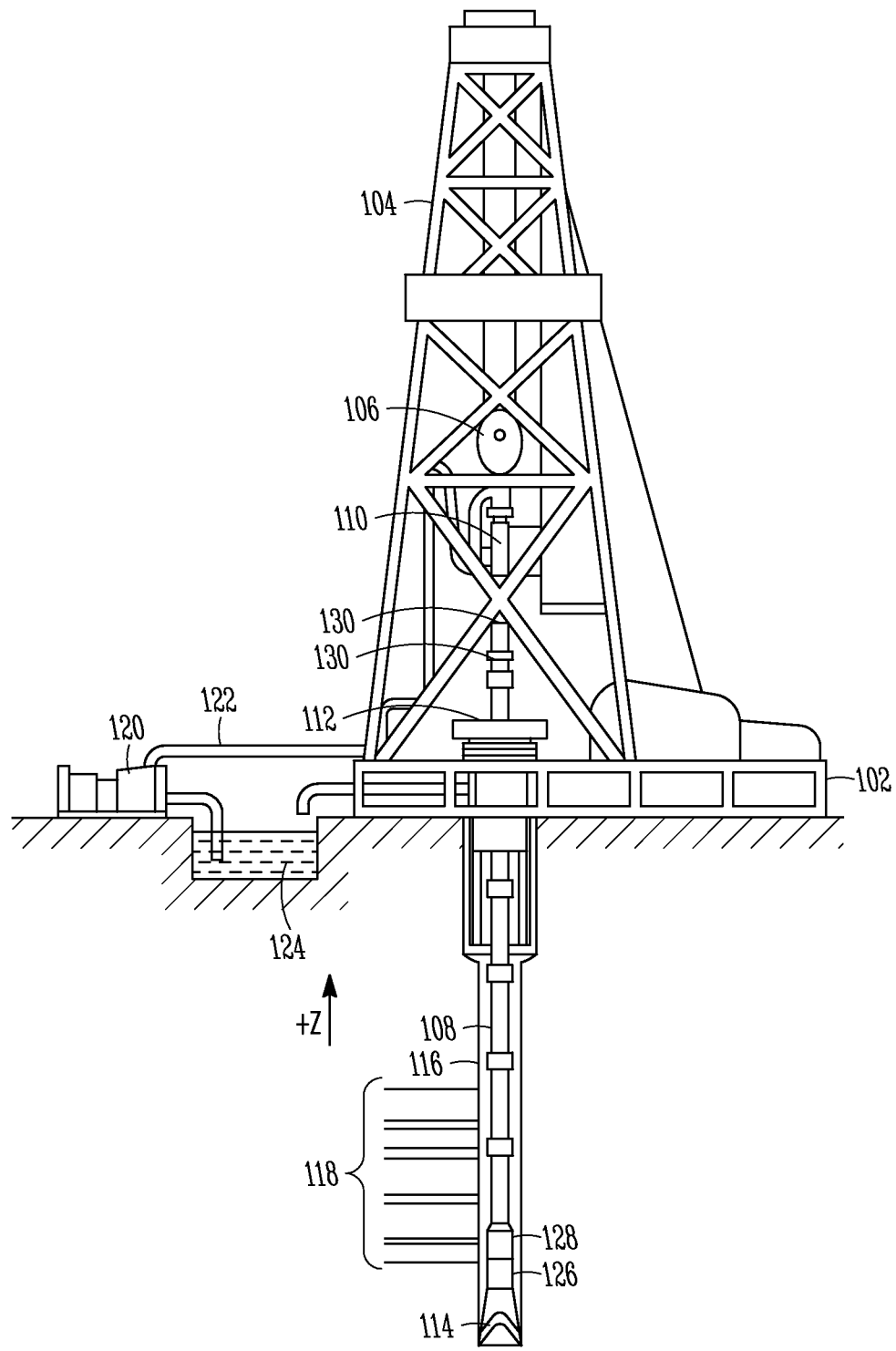
FIG. 1 is a schematic view of a system for capturing subsurface measurement data in a logging while drilling operation, in accordance with an example embodiment.

The following detailed description refers to the accompanying drawings that depict various details of examples selected to show how aspects of this disclosure may be practiced. The discussion addresses various examples of the inventive subject matter at least partially in reference to these drawings, and describes the depicted embodiments in sufficient detail to enable those skilled in the art to practice the subject matter disclosed herein. Many other embodiments may be utilized for practicing the inventive subject matter other than the illustrative examples discussed herein, and structural and operational changes in addition to the alternatives specifically discussed herein may be made without departing from the scope of the inventive subject matter.

In this description, references to "one embodiment" or "an embodiment," or to "one example" or "an example," are not intended necessarily to refer to the same embodiment or example; however, neither are such embodiments mutually exclusive, unless so stated or as will be readily apparent to those of ordinary skill in the art having the benefit of this disclosure. Thus, a variety of combinations and/or integrations of the embodiments and examples described herein may be included, as well as further embodiments and examples as defined within the scope of all claims based on this disclosure, and all legal equivalents of such claims.

An example embodiment of this disclosure comprises a system and a method for using multi-array laterolog measurement data to calculate an estimated value for the invasion depth of an invasion zone in a subsurface measurement zone in a one-dimensional optimization procedure. The system and method may thus comprise defining a one-dimensional optimization problem having the invasion depth as a sole variable measurement zone parameter, and solving the optimization problem by iterative modification of the invasion depth value.

The dimensionality of an optimization problem or procedure (which may comprise a minimization problem or procedure) indicates the number of variable parameters (also referred to herein as variable components) that are iteratively modified during solution of the optimization problem, or during performance of the optimization procedure, as the case may be. A one-dimensional optimization problem therefore has a single iteratively modified parameter or component, while a two-dimensional optimization problem has two iteratively modified parameters or components, and so forth.

The one-dimensional optimization problem may be a function to minimize a misfit error between multi-array measurement values indicative of resistivity of the subsurface measurement zone, and predicted measurement values calculated in accordance with a simulated measurement zone model based at least in part on the invasion depth. In one example embodiment, the optimization function defines a misfit error between (a) normalized differences between respective measurements of neighboring measurement arrays of the multi-array laterolog tool, and (b) normalized differences between respective predicted measurement values for neighboring measurement arrays.

The prediction model for the subsurface measurement zone may be based at least in part on an initial guessed value for resistivity of a geological formation in the subsurface measurement zone, and an initial guessed value for resistivity of the invasion zone. In some embodiments, the initial guessed values for the formation and invasion resistivity may be derived from the measurement data provided by the multi-array laterolog tool. In particular, measurements from a first and a last array in a series of arrays (corresponding to a shallowness measurement and eight deepest measurement), may be used to derive initial guessed values for the invasion zone and the geological formation respectively.

The estimated value for the invasion depth calculated in the one-dimensional optimization procedure may be used as an input for performance of a three-dimensional optimization procedure to calculate (a) an estimated value for formation resistivity, (b) an estimated value for invasion resistivity, and (c) a refined value for the invasion depth. Instead, the estimated value for the invasion depth calculated in the one-dimensional optimization procedure may be used as a fixed input parameter for performing a two-dimensional optimization procedure to calculate (a) an estimated value for formation resistivity, and (b) an estimated value for invasion resistivity.

FIG. 1 is a schematic illustration of an example logging while drilling (LWD) environment. A drilling platform 102 is equipped with a derrick 104 that supports a hoist 106 for raising and lowering a drill string 108. The hoist 106 suspends a top drive 110 suitable for rotating the drill string 108 and lowering the drill string 108 through the well head 112. Connected to the lower end of the drill string 108 is a drill bit 114. As the drill bit 114 rotates, it creates a borehole 116 that passes through various formations 118. A pump 120 circulates drilling fluid through a supply pipe 122 to top drive 110, down through the interior of drill string 108, through orifices in drill bit 114, back to the surface via an annulus around drill string 108, and into a retention pit 124. The drilling fluid transports cuttings from the borehole 116 into the pit 124 and aids in maintaining the integrity of the borehole 116. Various materials can be used for drilling fluid, including a salt-water based conductive mud.

An assembly of LWD tools 126 is integrated into a bottom-hole assembly (BHA) near the bit 114. As the bit 114 extends the borehole 116 through the formations 118, LWD tools 126 collect measurements relating to various formation properties as well as the tool orientation and various other drilling conditions. The LWD tools 126 may take the form of a drill collar, i.e., a thick-wall led tubular that provides weight and rigidity to aid the drilling process. In this example embodiment, the LWD tools 126 include a multi-array laterolog resistivity tool to measure formation resistivity, for example such as described with reference to FIGS. 4 and 5. A telemetry sub 128 may be included to transfer images and measurement data to a surface receiver 130 and to receive commands from the surface. In some embodiments, the telemetry sub 128 does not communicate with the surface, but rather stores logging data for later retrieval at the surface when the logging assembly is recovered.

Figure 2:
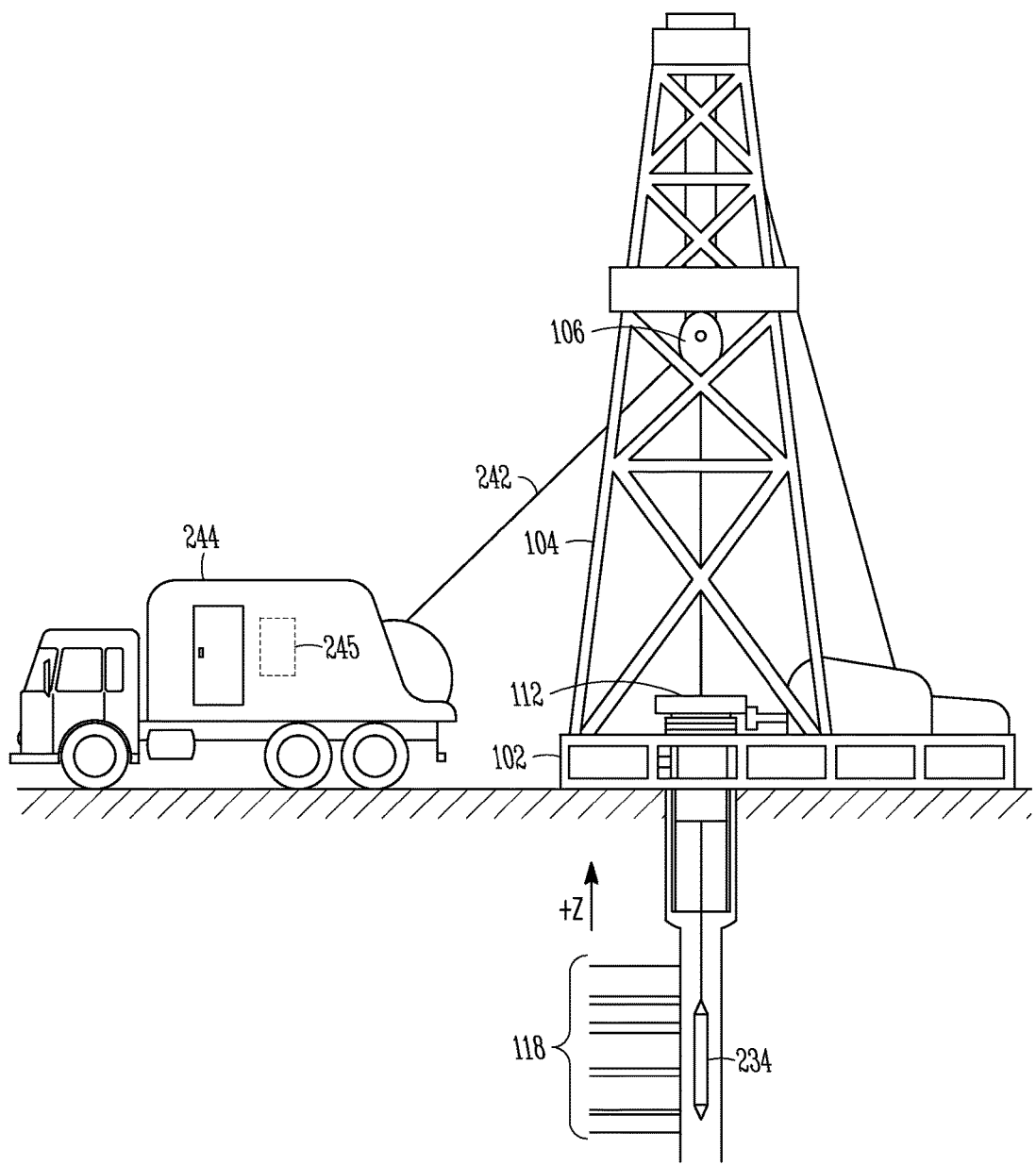
FIG. 2 is a schematic view of a system for capturing subsurface measurement zone in a wireline logging operation, in accordance with an example embodiment.

At various times during the drilling process, the drill string 108 may be removed from the borehole 116 as shown in FIG. 2. Once the drill string 108 has been removed, logging operations can be conducted using a wireline logging sonde 234, i.e., a probe suspended by a cable 242 having conductors for conducting power to the sonde 234, and for transmitting telemetry data from the sonde 234 to the surface. The example wireline logging sonde 234 may have pads and/or centralizing springs to maintain the sonde 234 near the central axis of the borehole 116 as sonde 234 is pulled uphole. The logging sonde 234 can include a variety of sensors including a multi-array laterolog tool for measuring formation resistivity. A logging facility 244 collects measurements from the logging sonde 234, and includes a computer system 245 for processing and storing the measurements gathered by the sensors.

Figure 3:
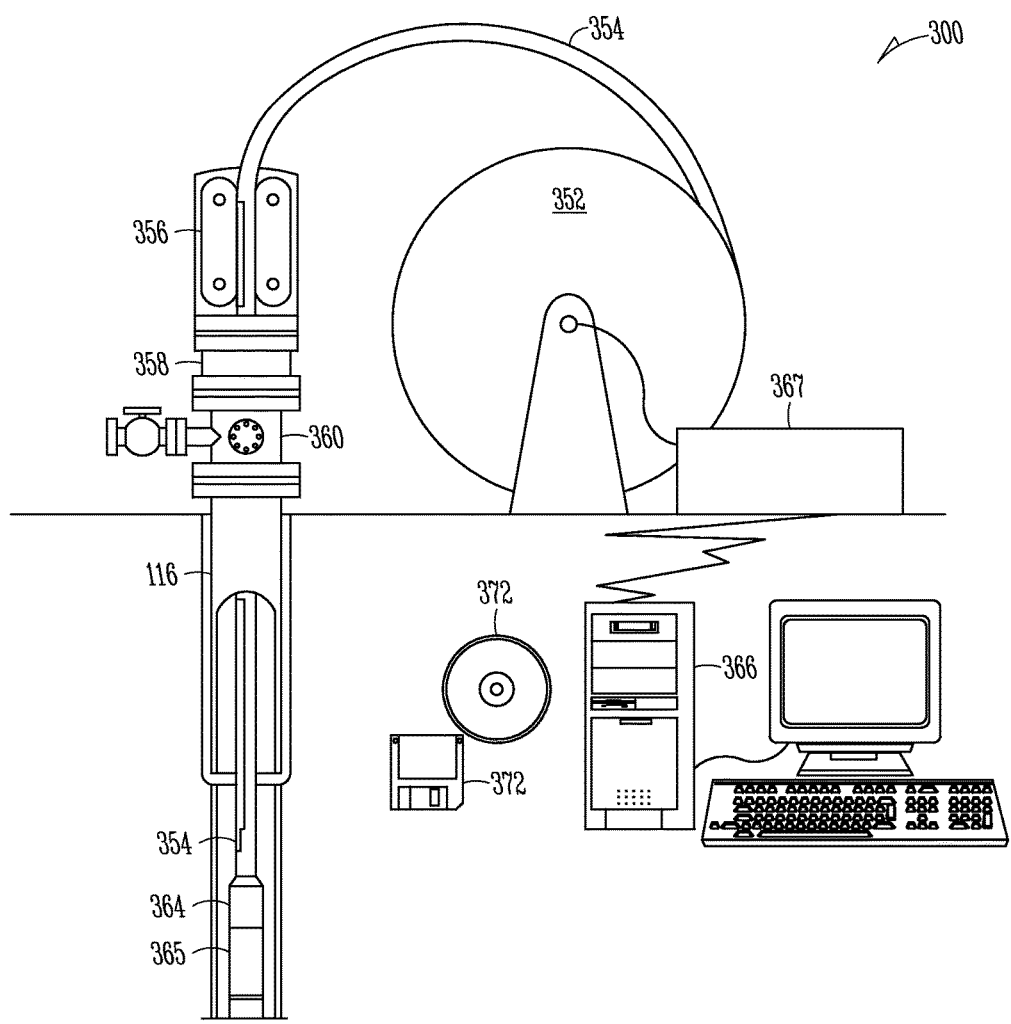
FIG. 3 is a schematic view of a coil tube logging system for capturing subsurface measurement zone time in accordance with an example embodiment.

Yet a further alternative logging technique is schematically illustrated in FIG. 3, which shows an example embodiment of a coil tubing logging system 300. In system 300, coil tubing 354 is pulled from a spool 352 by a tubing injector 356 and injected through a packer 358 and a blowout preventer 360 into the borehole 116. In the borehole 116, a supervisory sub 364 and one or more logging tools 365 are coupled to the coil tubing 354 and configured to communicate to a surface computer system 366 via information conduits or other telemetry channels. An uphole interface 367 may be provided to exchange communications with the supervisory sub 364 and receive data to be conveyed to the surface computer system 366.

Surface computer system 366 is configured to communicate with supervisory sub 364 to set logging parameters and collect logging information from the one or more logging tools 365, in this example embodiment including a multi-array laterolog tool similar or analogous to the example embodiment described with reference to FIG. 5. Surface computer system 366 is configured by software (shown in FIG. 3 as being stored on example embodiments of removable storage media 372) to monitor and control downhole instruments 364, 365. The surface computer system 366 may be a computer system such as that described with reference to FIG. 13.

Figure 4:
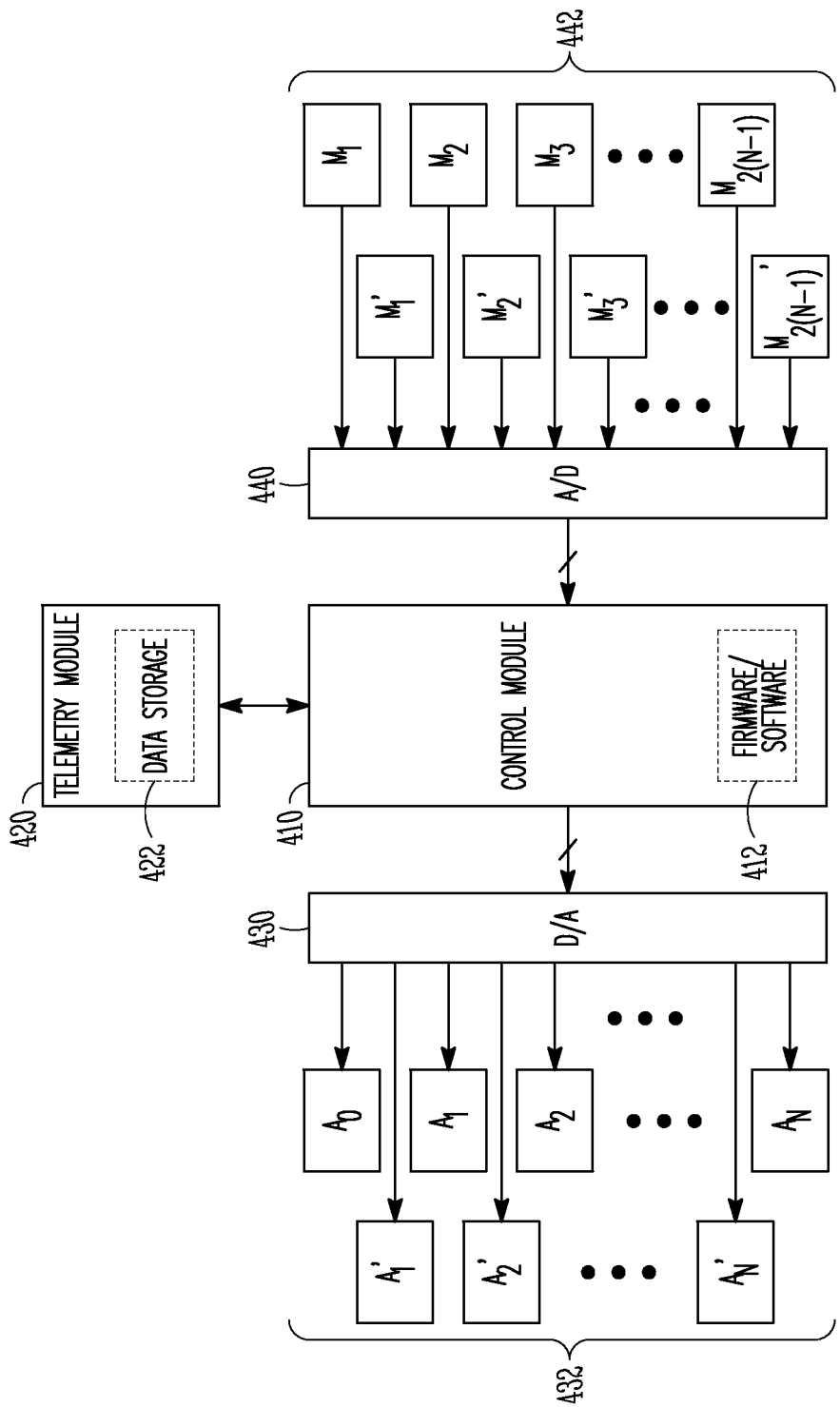
FIG. 4 is a schematic block diagram of electronics for a multi-array laterolog tool, in accordance with an example embodiment.
Figure 5:
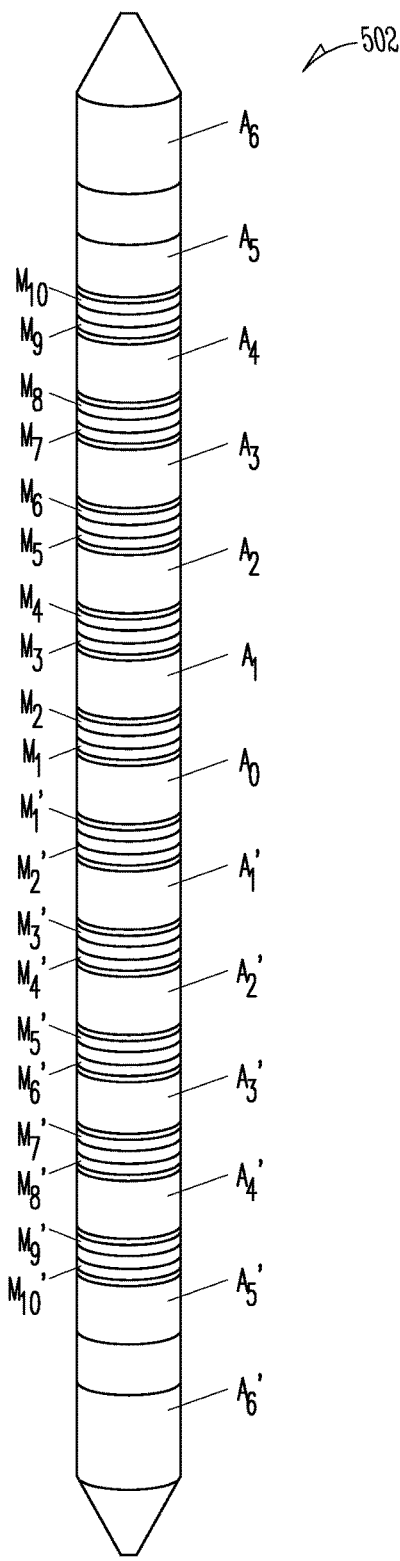
FIG. 5 is a schematic three-dimensional view of a multi-array laterolog tool, in accordance with an example embodiment.

FIG. 4 shows a functional block diagram of tool electronics for an example embodiment of a multi-array laterolog tool 502, the physical construction of which is schematically illustrated in FIG. 5. FIGS. 4 and 5 therefore describe different aspects of a single embodiment of the multi-array laterolog tool 502. The electronics includes a control module 410 which governs operation of the tool 502 in accordance with software and/or firmware 412 stored in memory. The control module 410 couples to telemetry module 420 to receive commands and to provide measurement data. Control module 410 further connects to digital-to-analog converter 430 to drive current electrodes 432, and connects to analog-to-digital converter 440 to make voltage measurements via monitor electrodes 442. Control module 410 can be, for example, a general purpose processor, a digital signal processor, a programmable gate array, or an application specific integrated circuit. Telemetry module 420 receives and stores measurement data in a nonvolatile memory providing data storage 422, and further operates as a communications interface between the control module 410 and the telemetry communications mechanism.

FIG. 4 shows 2N+1 current electrodes (electrodes $A_0$, $A_1$, $A_2$, ... $A_N$, $A_1'$, $A_2'$, ... $A_N'$) being independently driven via digital-to-analog converter 430. In some tool embodiments, the guard electrodes are electrically connected in pairs, i.e., electrode $A_1$ is connected to electrode $A_1'$ by an electrical conductor, electrode $A_2$ is connected to electrode $A_2'$, etc. Moreover, the return electrodes are electrically connected (i.e., electrode $A_N$ is conductively coupled to electrode $A_N'$). In such alternative embodiments, the digital-to-analog converter 430 can be simplified to drive only one electrode in each pair. Similarly, the monitor electrodes 442 can be electrically connected in pairs, i.e., with electrode $M_1$ connected to $M_1'$, electrode $M_2$ connected to $M_2'$, etc. It is also contemplated that each electrode can be individually driven/sensed and that the control module 410 can collect the pair-wise measurements by appropriately combining the individual electrode currents and voltages.

Turning now to FIG. 5, the example embodiment of the multi-array laterolog tool 502 is shown (for ease of illustration) as having equally-spaced current electrodes and return electrodes (electrodes $A_0$, $A_1$, $A_2$, ... $A_6$, $A_1'$, $A_2'$, ... $A_6'$), with interspersed monitor electrodes $M_1$-$M_{10}$ and $M_1'$-$M_{10}'$ on a wireline tool body. The monitor electrodes 442 are separated from the current electrodes 432 because the current electrodes 432 tend to develop an impedance layer that distorts voltage measurements when current is flowing. Note that, in practice, the electrodes are often not equally sized and spaced, as better performance may be achieved by having the more distant electrodes increase in size. Thus, in one or more contemplated embodiments the center electrode $A_0$ has an axial length of 6 inches, and the lengths of electrodes $A_i$ and for i ranging from 1 to 6, are (in inches) 6, 8, 10, 14, 20, and 75, respectively. The spacing between the current electrodes 432 may also increase, for example, beginning at 6 inches between electrodes $A_0$ and $A_1$, 6 inches between electrodes $A_1$ and $A_2$, 10 inches between electrodes $A_2$ and $A_3$, 14 inches between $A_3$ and $A_4$, 19 inches between $A_4$ and $A_5$, and 34 inches between $A_5$ and $A_6$. These spacings are measured between the nearest respective electrode edges and not center to center, and they are symmetric with respect to the center electrode. In one or more example embodiments, each of the monitor electrodes 442 can have an axial length of 1 inch. The monitor electrodes 442 can be spaced 1 inch away from the nearest current electrode 432 (with a single exception), and electrodes $M_2$ and $M_2'$ can be spaced 2 inches from current electrodes $A_1$ and $A_1'$, respectively.

Figure 6:
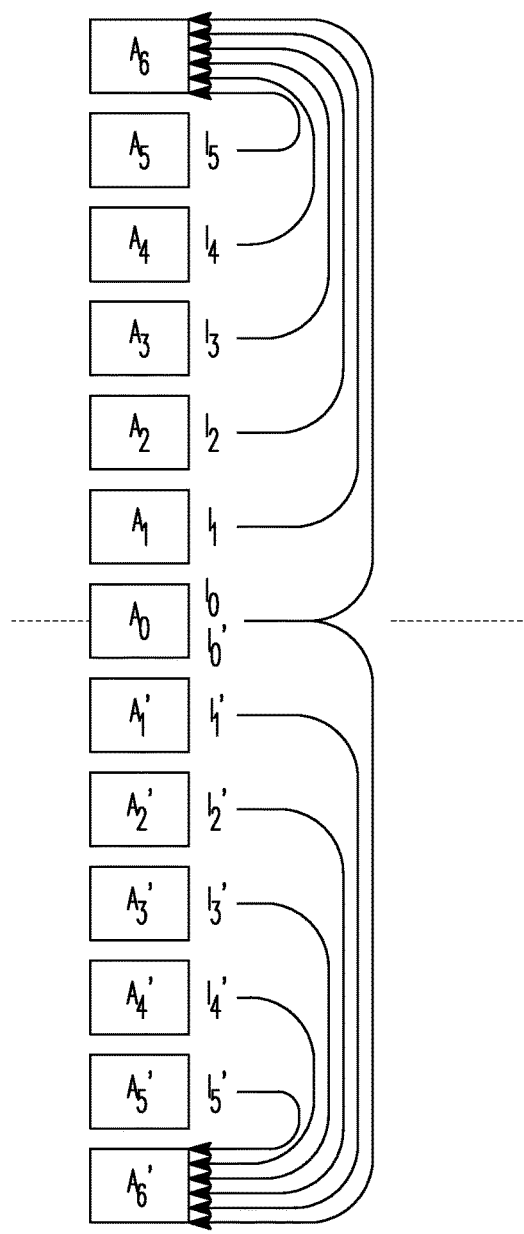
FIG. 6 is a schematic diagram illustrating a current flow patent for a multi-array laterolog tool with six sets of guard electrodes, in accordance with an example embodiment.

The tool electronics employ the current electrodes 432 to generate currents $I_0$-$I_5$ and $I_0'$-$I_5'$ as illustrated in FIG. 6. Currents $I_0$-$I_5$ are sourced from electrodes $A_0$-$A_5$ respectively, with electrode $A_6$ serving as a common return electrode for each of these currents. Similarly, currents $I_0'$-$I_5'$ are sourced from electrodes $A_0$ and $A_5$ respectively, with electrode $A_6'$ serving as a common return electrode for these currents. If the current electrodes 432 and monitor electrodes 442 are pair-wise connected as discussed before, the tool 502 in this described example embodiment cannot distinguish currents $I_0$-$I_5$ from $I_0'$-$I_5'$, but instead operates on the combined currents ($I_0+I_0'$, $I_1+I_1'$, $I_2+I_2'$, ... ). Otherwise, the tool can analyze currents $I_0$-$I_5$ separately from $I_0'$-$I_5'$, or in the alternative, combine the currents and voltages digitally before analyzing.

To enable the monitor electrodes 442 to distinguish the effects of the various currents, the currents can be given distinguishable features. In one or more example embodiments, the current electrodes 432 can be pair-wise connected and currents $I_0$-$I_5$ can have distinguishable signal frequencies. For example, the set of frequencies can include 80 Hz, 115 Hz, 145 Hz, 185 Hz, 235 Hz, and 285 Hz. The respective currents can in other embodiments be distinguished through the use of time division multiplexing, code division multiplexing, or other methods that enable the currents to be independently monitored.

As the tool drives the current electrodes 432, the currents pass through the borehole fluid and the formation 118 to reach the respective return electrodes, creating a field potential indicative of the resistivity of the materials along the various current flow paths. The control module 410 records a voltage signal from each monitor electrode 442 to measure the field potential at the respective monitor electrode 442 locations. A frequency analysis of the voltage signals (e.g., by Fourier transform, filtering, or least-squares curve fitting) separates out those voltage signal components attributable to each of the currents. As is well-established in the art, and as can be seen with reference to FIG. 6, the respective current flow paths of different electrode pairs extend radially from the tool 502 by different distances. By determining measurements for each of the array sizes, the tool 502 can provide resistivity measurements not only as a function of tool position, but also as a function of radial distance from the borehole 116. The multi-array laterolog tool 502 in other words offers measurements at different depths of investigation (DOI). Note that the example measurement data processing and analysis methods described below can be performed with respect to depth-variant measurements indicative of overall resistivity of a subsurface zone or measurement zone which may have been gathered in a manner different from the described example multi-array laterolog tool 502.

Measurements captured by the tool 502, however, are indicative of resistivity of the overall subsurface zone in which measurements are taken, and are thus often not dependent only on the resistivity of the relevant geological formation 118. This is because the process of drilling itself often actually modifies the resistivities of formations 118 in the vicinity of the borehole 116 through a process known as "invasion," as schematically shown in a simplified illustration of FIG. 7. In cases where the formation 118 is permeable, mud filtrate can penetrate the formation 118 from the borehole 116, displacing formation water and oil or gas. The result of invasion is generally to create an invasion zone 707 which is more highly resistive than the invaded formation 118. The subsurface zone in which measurements are taken thus comprises the geological formation 118, as well as the invasion zone 707 projecting radially into the geological formation 118 from the borehole 116. The depth of invasion (denoted L), can vary greatly depending on the characteristics of the borehole 116 and the relevant formation 118.

Broadly, the depth of invasion is a function of formation porosity/permeability properties. Measurement values obtained from the tool 502 of downhole locations where invasion has occurred are thus indicative of the resistivity of the composite subsurface structure. For most real field applications, invasion zones 707 exist and their shape is assumed to be a step-function. Resistivity measurements taken by the tool 502 indicate the collective resistivity of the composite subterranean structure in the measurement zone, and is generally modeled as being dependent on the following fundamental parameters: resistivity of the invasion zone 707, referred to herein as invasion resistivity and denoted $R_{xo}$; the depth of the invasion zone 707 in a radial direction relative to the borehole 116, referred to herein as invasion depth and denoted L; and resistivity of the underlying geological formation 118 through which the borehole 116 extends, referred to herein as formation resistivity and denoted $R_t$.

Because single measurement values are dependent on multiple unknown parameters, a simple linear solution of a mathematical function based on the measurement data to derive the true formation resistivity (RT) is not possible. Existing methods for post-processing log data of a multi-array laterolog tool to estimate characteristics subsurface formations comprise iterative optimization. In other words, formation properties are estimated by minimizing an optimization problem, where misfit errors are defined as between measurement data and simulation data with estimated formation properties. Once misfit errors are sufficiently small, estimated formation properties are assumed to be close to true formation properties. In such existing postprocessing methods, the three fundamental unknown parameters mentioned above are inverted simultaneously.

The associated optimization function can be expressed by the following equation:

$$f(R_{xo}, R_t, L) = \sum_{i=1}^{N} w_i |\sigma_m^i - S^i(R_{xo}, R_t, L)|^2 \quad (1)$$

where N is the number of arrays in the tool 502, $w_i$ is a weighting factor applied to the $i^{th}$ array, $\sigma_m^i$ is the log measurement value at the $i^{th}$ array, and $S^i$ is a simulated log value at $i^{th}$ array. In Equation (1), the respective log measurements ($\sigma$) and the respective simulated log values (S) indicate apparent conductivity (measured in S/m, which can be converted from measured field potentials with respect to multi-array laterolog tool geometry), and are thus respectively indicative of measured resistivity and simulated resistivity, as being inversely proportional thereto. The simulated log values ($S^i$) can be expressed in Equation (1) as a function of the three unknown parameters ($R_{xo}$, $R_t$, L).

Minimization problems associated with Equation (1) are three-dimensional (3-D) problems, since they have three variable components provided by the three variable parameters ($R_{xo}$, $R_t$, L), and are to compute, as output, estimated values for all three these parameters. The optimization operation thus comprises iteratively modifying the values for the invasion resistivity, the formation resistivity, and the invasion depth, to minimize the differences between the log measurement values and the simulated log values for the respective arrays of the multi-array laterolog tool 502.

The processing of measurement data collected by the example multi-array laterolog tool 502 in accordance with the present example embodiment, however, uses a different optimization framework in which a value for the invasion depth (L) is estimated in a 1-D optimization procedure. Measurements by all the arrays of the multi-array laterolog tool 502 are sensitive to invasion resistivity ($R_{xo}$), invasion depth (L), and formation resistivity ($R_t$). The inventor has recognized, however, that normalized differences between measured values for neighboring arrays show enhanced sensitivity to invasion depth (L). The example embodiment of the described optimization framework proceeds on the insight, based on the phenomenon discussed above, that normalized difference values from different arrays can be used to calculate invasion depth (L) efficiently with non-variable estimated values for invasion resistivity ($R_{xo}$) and formation resistivity ($R_t$). The inventor has found that the disclosed 1-D version method can provide accurate estimations for invasion depth (L) even where very inaccurate estimated values for invasion resistivity ($R_{xo}$) and formation resistivity ($R_t$) are employed.

In this example embodiment, a modified optimization function to estimate invasion depth (L) is defined as follows, further referred to as Equation (2):

$$f(L) = \sum_{i=1}^{N-1} w_i \left| \frac{\sigma_m^{i+1} - \sigma_m^i}{\sigma_m^N - \sigma_m^1} - \frac{S^{i+1}(R_{xo} = R_{xo}^{guess}, R_t = R_t^{guess}, L) - S^i(R_{xo} = R_{xo}^{guess}, R_t = R_t^{guess}, L)}{S^N(R_{xo} = R_{xo}^{guess}, R_t = R_t^{guess}, L) - S^1(R_{xo} = R_{xo}^{guess}, R_t = R_t^{guess}, L)} \right|^2$$

where N is the number of arrays of the multi-array laterolog tool 502, $w_i$ is a weighting factor applied to $i^{th}$ array, $\sigma_m^i$ is log measurement value at $i^{th}$ array, $S^i$ is simulated log value at $i^{th}$ array, $R_{xo}^{guess}$ a non-variable estimated value for $R_{xo}^{guess}$, and $R_t^{guess}$ is a non-variable estimated value for $R_t$.

Equation (2) defines a 1-D quadratic energy function to find a value for the single variable component, invasion depth (L), at which normalized differences between simulated log values for neighboring arrays ($S^{i+1} - S^i$) and normalized differences between log measurement values for corresponding neighboring arrays ($\sigma^{i+1} - \sigma^i$) are substantially at a minimum. These differences are normalized through division, respectively, by: the difference between simulated log values for the first and the last arrays in the series ($S^N - S^1$); and the difference between log measurement values for the first and the last arrays in the series ($\sigma_m^N - \sigma_m^1$).

Note that the only variable component of each simulated log value (S) is the invasion depth (L). For this reason, minimization problems associated with Equation (2) are 1-D problems, since only invasion depth (L) is calculated. Solving 1-D minimization problems is computationally fast and efficient, particularly in comparison to the 3-D optimization problems often computed during performance of existing, conventional postprocessing techniques.

Figure 8:
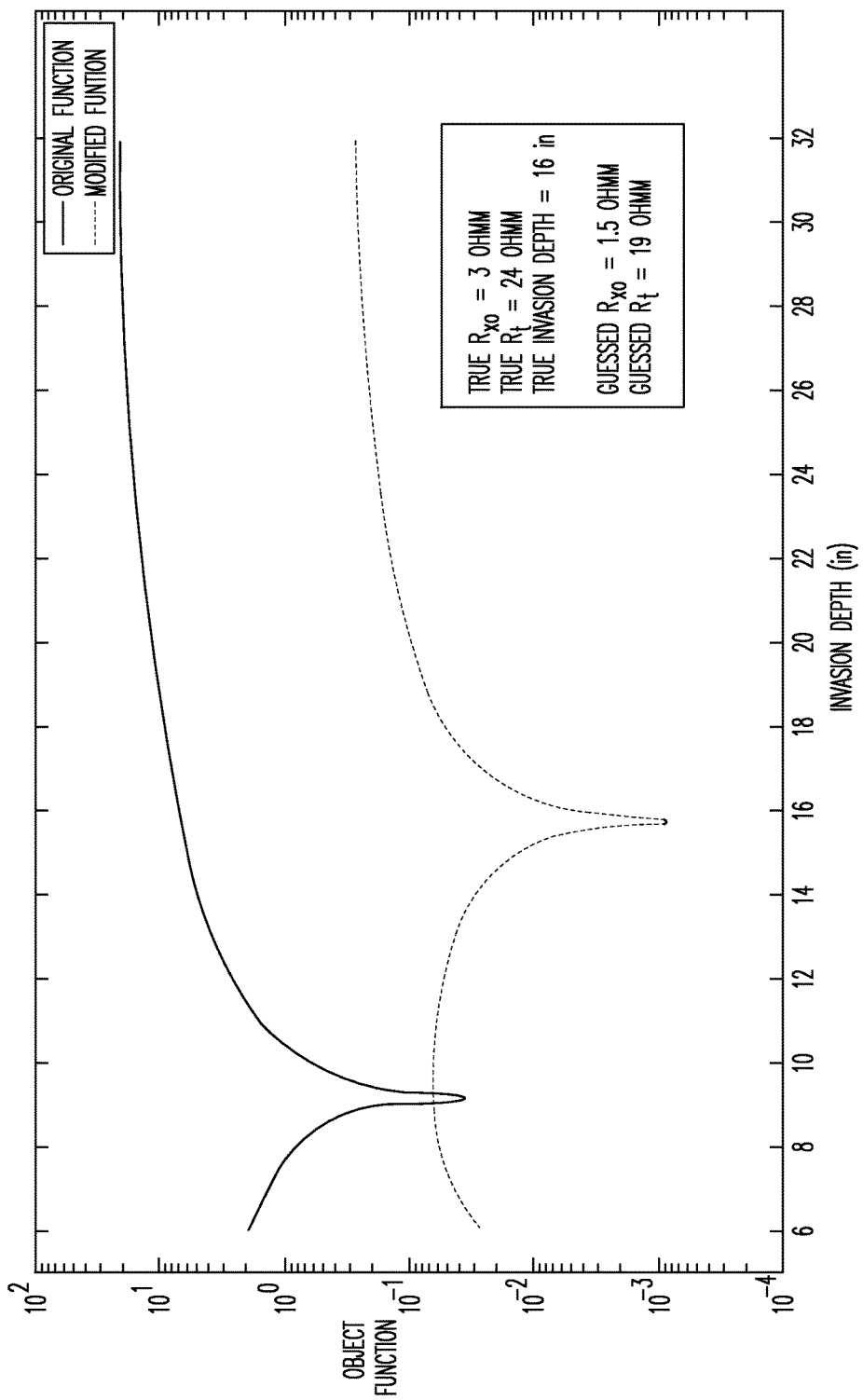
FIG. 8 is a graph illustrating a one-dimensional optimization procedure for estimating invasion depth for an invasion zone in a subsurface measurement zone, in accordance with one example embodiment.

To demonstrate effectiveness of the modified optimization framework of the described example embodiment, and including Equation (2), an analysis of a synthetic formation model is now discussed, as illustrated with reference to FIG. 8. In the synthetic formation module and discussion, the true values for the three fundamental parameters discussed above (which are, of course, initially unknown) are as follows: the true invasion resistivity ($R_{xo}$) is 6 Ohm-m, the true formation resistivity ($R_t$) is 24 Ohm-m, and the true invasion depth (L) is 16 inches. FIG. 8 depicts computed misfit function magnitudes of Equation (1) and Equation (2) respectively, using an initial guessed value for invasion resistivity ($R_{xo}$) equal to 1.5 Ohm-m, and an initial guessed value for formation resistivity ($R_t$) equal to 19 Ohm-m. As can be seen in the respective curves for Equation (1) and Equation (2) in FIG. 8, the x-axis location for the minimum value of the modified misfit energy function of Equation (2) is almost identical to the true invasion depth value (L). In contrast, the minimum location calculated based on the conventional optimization framework of Equation (1) is 11 inches. As demonstrated by this analysis, the modified optimization function of Equation (2) produces an accurate estimation of invasion depth (L), even with inaccurate initial guessed values for the invasion resistivity ($R_{xo}$) and the formation resistivity ($R_t$).

Figure 9:
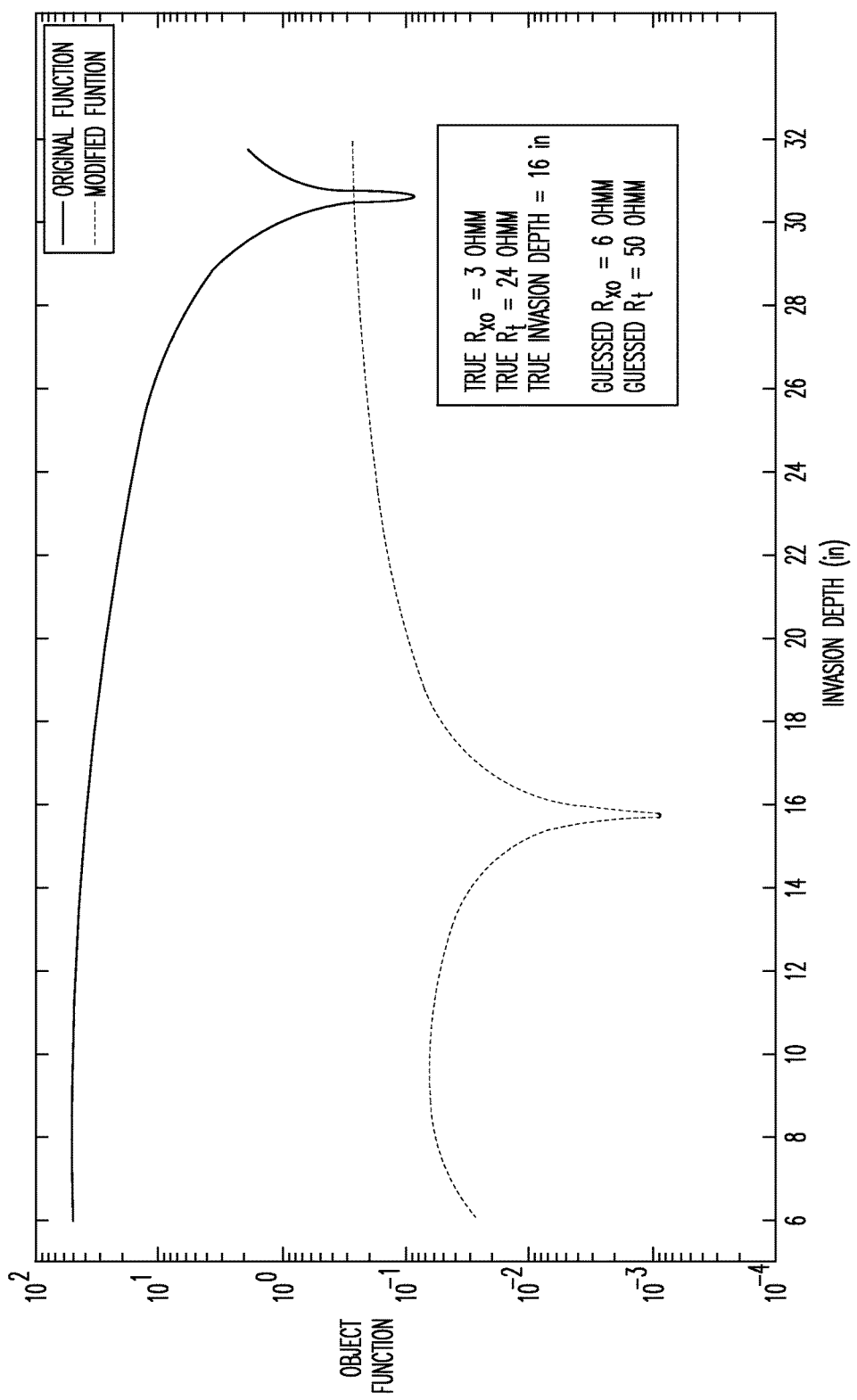
FIG. 9 is a graph illustrating a one-dimensional optimization procedure for estimating invasion depth of an invasion zone in the subsurface measurement zone, in accordance with another example embodiment.

FIG. 9 shows a graphic analysis similar to that discussed above with reference to FIG. 8, but with initial estimated or guessed resistivity values for the formation and the invasion zone that are even further away from the true values. The computed misfit function values of FIG. 9 for both Equation (1) and Equation (2) are based on a guessed value for invasion resistivity ($R_{xo}$) equal to 6 Ohm-m and a guessed value for formation resistivity ($R_t$) equal to 50 Ohm-m. As is clear from interpretation of the curves of FIG. 9, an optimization framework using an optimized misfit function based on the normalized differences between neighboring arrays produces an accurate estimate for the invasion depth value (L) even with very inaccurate initial values for the modeled or simulated formation structure.

Once invasion depth (L) is determined based on guessed formation and invasion zone resistivity values and by use of the optimization framework presented by Equation (2), the estimated invasion depth (L) can be used as an initial guess value for conventional 3-D optimization problems to accelerate convergence. In other embodiments, the estimated invasion depth (L) can be used as a known parameter (i.e., a non-variable component) in a 2-D optimization problem which calculates only $R_{xo}$ and $R_t$.

Figure 7:
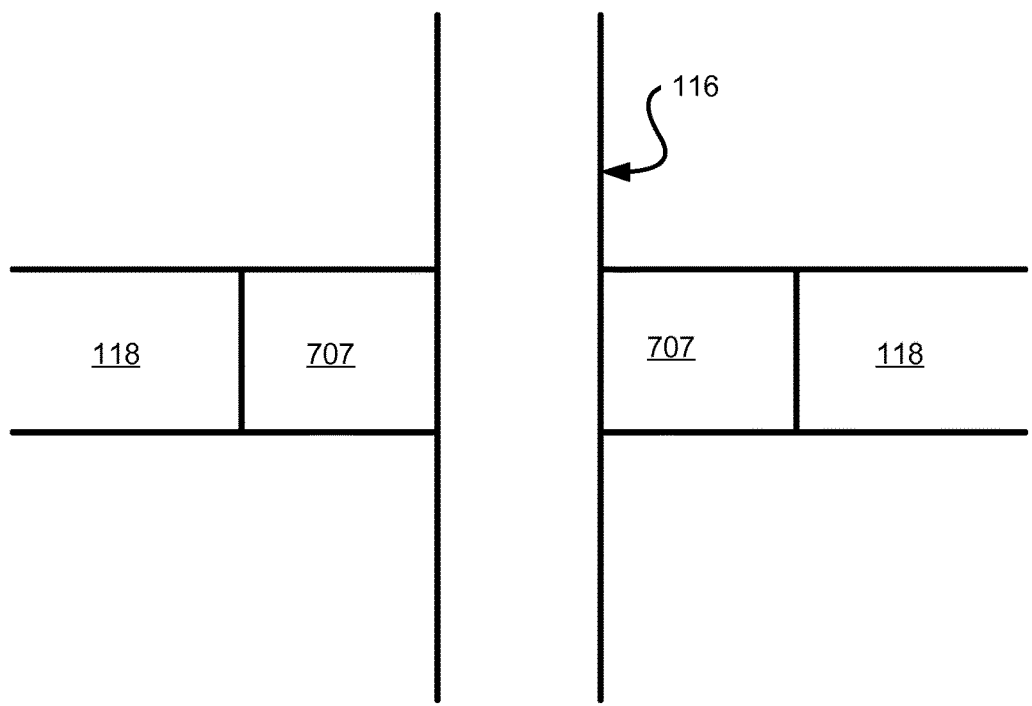
FIG. 7 is a simplified schematic longitudinal section of a subsurface measurement zone through which a borehole extends, the subsurface measurement zone comprising a geological formation and an invasion zone.
Figure 10:
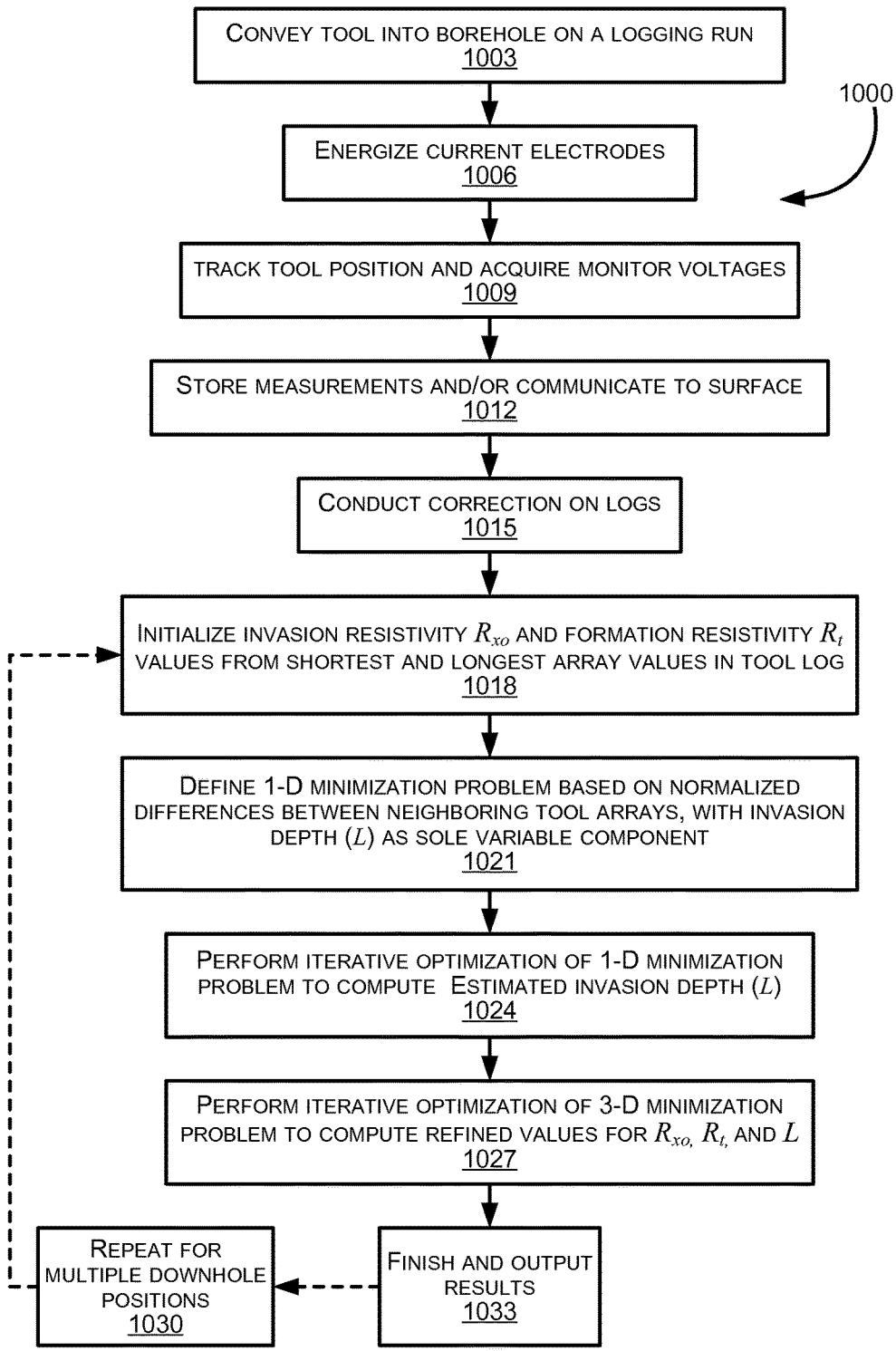
FIG. 10 is a schematic flowchart of a method for estimating subsurface formation and invasion properties, according to one example embodiment.

Turning now to FIG. 10, reference numeral 1000 generally indicates a flow chart illustrating example embodiment of a method for estimating formation and invasion properties based on depth-variant measurement data indicating resistivity parameters for a subsurface measurement zone at different radial depths of investigation relative to the example borehole 116 of FIG. 1, which extends through the measurement zone comprising the example formation 118 and invasion zone 707 of FIG. 7. The method 1000 is commenced, at operation 1003, by conveying the multi-array laterolog tool 502 (FIG. 5) into the borehole 116 on a logging run, with the borehole 116 containing a conductive fluid. As described with reference to FIGS. 1-3, this may be done in a logging while drilling operation (FIG. 1), in a wireline logging operation (FIG. 2), or with a coiled tube logging system (FIG. 3).

At operation 1006, the current electrodes 432 (FIG. 4) are energized to generate debts-variant field potentials in a subsurface measurement zone comprising a subsurface volume surrounding the borehole 116 at the current downhole position of the tool 502. At operation 1009, the tool 502 or some other component of the system tracks the motion and/or downhole position of the tool 502 and samples the voltage signals from the split monitor electrodes 442. At operation 1012, measurement data comprising the measured voltage signal data is written to a storage medium on the tool 502, and/or is communicated to a processing facility on the surface. At operation 1015, the measurement logs captured by the tool 502 are subjected to preprocessing to correct the measurement data by removing unwanted effects, like borehole effects and other effects.

At operation 1018, initial values for invasion resistivity $R_{xo}$ and formation resistivity $R_t$ are estimated for use as a non-variable components of the one-dimensional minimization problem expressed as Equation (2). As illustrated with reference to FIGS. 8 and 9, it is a benefit of the optimization framework disclosed in this example embodiment that it is not particularly sensitive to the accuracy of initial estimates for $R_{xo}$ and $R_t$. Nevertheless, the inventors found that suitable initial values for $R_t$ and $R_{xo}$ can be estimated based on apparent conductivity measurement values provided by the tool 502 for the arrays at opposite ends of the series of arrays in the multi-array tool 502. In this example, initial values for $R_{xo}$ and $R_t$ are thus estimated from the shortest and longest array values. For example, $$R_{xo}^{guess}=1/\sigma_m^1, \text{ and}$$

$$R_t^{guess}=1/\sigma_m^N.$$

At operation 1021, the optimization framework is provided by defining a one-dimensional minimization problem using the estimated formation resistivity and invasion resistivity values, with the minimization problem being based on normalized differences between log measurement values for neighboring arrays of the tool 502. In particular, Equation (2) as described previously is defined in operation 1021. Note that this optimization function is a one-dimensional optimization problem, in that optimization comprises interactive modification of only a single variable component, namely the invasion depth L.

At operation 1024, the radial invasion depth L for the invasion zone 707 at the relevant downhole position is computed by solving the one-dimensional minimization problem defined as Equation (2). As mentioned, this comprises interactive modification of the value for the invasion depth L, to find a particular value for the invasion depth L at which a misfit error for (a) normalized differences between simulated values for neighboring tool arrays to (b) normalized differences between measured values for neighboring tool arrays is at a minimum. The value of the invasion depth L that corresponds to the minimum misfit error is taken as the computed value for the radial depth L of invasion zone 707.

At operation 1027, the computed value of the radial depth L is used as an initial value in a 3-D minimization problem in which all three of the fundamental parameters (L, $R_{xo}$, and $R_t$) are variable components that are iteratively modified. In this example embodiment, the 3-D minimization problem of operation 1027 is defined according to Equation (1) as described above. At operation 1033, the complete results of the 3-D minimization problem are outputted and stored as the calculated values for the invasion depth (L), the invasion resistivity ($R_{xo}$), and the true formation resistivity ($R_t$) corresponding to the downhole position at which the measurement data was captured. Operations 1018 through 1033 may be repeated, at operation 1030, for multiple downhole positions along the borehole 116, to give an estimated image of formation characteristics surrounding the borehole 116 along its length.

Figure 11:
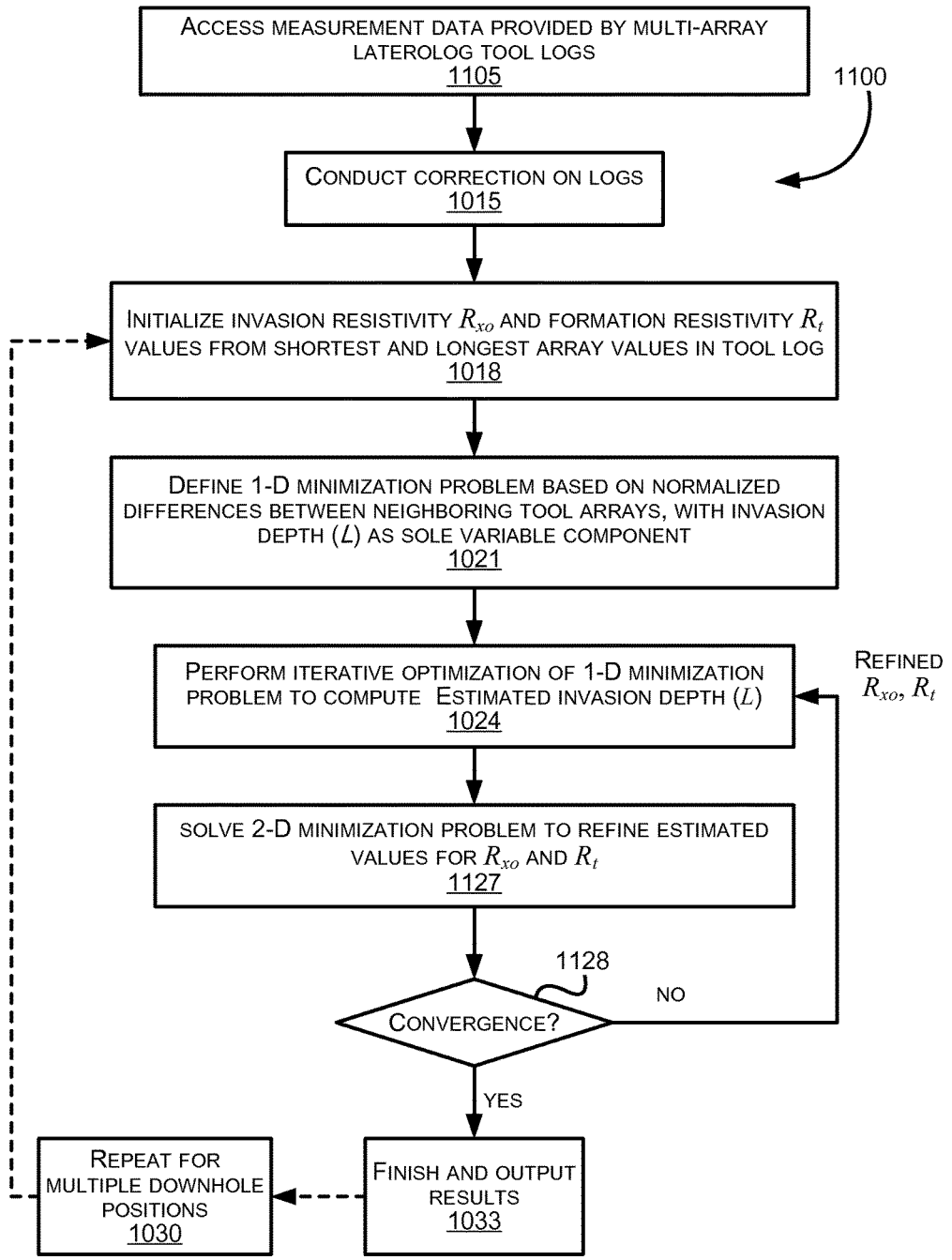
FIG. 11 is a schematic flowchart of a method for estimating subsurface formation and invasion properties, according to another example embodiment.

FIG. 11 shows an overview of an alternative method 1100 for estimating formation and invasion characteristics, in accordance with another example embodiment. Measurement data indicative of depth-variant resistivity values for a measurement zone surrounding the borehole 116 is accessed at operation 1105. This measurement data has been captured in the process corresponding to operations 1003 through 1012 of the method 1000 of FIG. 10. The example method 1100 of FIG. 11 is analogous to the example method 1000 of FIG. 10, with a major distinction being that the estimated value for the invasion depth ($L^{est}$) computed in the one-dimensional optimization procedure of operation 1024 is used as a non-variable component in a two-dimensional minimization problem, at operation 1127, to calculate estimated values for the invasion resistivity ($R_{xo}$) and the formation resistivity ($R_t$).

By "two-dimensional minimization problem" is meant that the particular function which is iteratively optimized has two variable components that are iteratively modified during minimization computation. These variable components are provided by the invasion resistivity ($R_{xo}$) and the formation resistivity ($R_t$). In this example embodiment, the two-dimensional minimization problem of operation 1127 is expressed, $$f(R_{xo}, R_t) = \sum_{i=1}^{N} w_i |\sigma_m^i - S^i(R_{xo}, R_t, L=L^{est})|^2 \quad (3)$$

where $L^{est}$ is the estimated invasion depth calculated in the one-dimensional optimization procedure of operation 1024, according to Equation (2).

At operation 1128, the automated method 1100 includes checking for convergence of the computed values for the respective parameters. If convergence is satisfied in operation 1128, then the latest computed values are outputted, at operation 1033, as the estimated values for the three fundamental parameters (L, $R_{xo}$, and $R_t$). Otherwise, if convergence is not satisfied, then operations 1024 and 1127 are repeated. In particular, the one-dimensional minimization problem is recalculated using the latest (or refined) values for $R_{xo}$, $R_t$ to update $R_{xo}^{guess}$ and $R_{xo}^{guess}$, thereby providing a refined estimate value for the invasion depth ($L^{est}$). This refined estimated invasion depth value is in turn used as non-variable input for the 2-D minimization problem of Equation (3). The computed values for the three fundamental parameters are thus iteratively refined in a two-stage optimization framework, until convergence is satisfied, at operation 1128.

One benefit of the above-described example systems and methods for estimating subterranean formation and invasion characteristics is that automated analysis of depth-variant resistivity measurements to derive estimated formation and invasion parameters are provided by a series of lower-dimensional minimization problems. In particular, one initially unknown parameter of the physical structure and characteristics of a subsurface measurement zone is computed in a 1-D optimization procedure. This provides computational efficiency and robustness, particularly in comparison to existing three-dimensional optimization procedures. Robustness of the described optimization function for estimating invasion depth, and in particular its tolerance to inaccurate initial estimates for formation resistivity and invasion resistivity, promotes robustness, consistency, and accuracy of the automated analysis of the measurement data for estimating formation characteristics.

Figure 12:
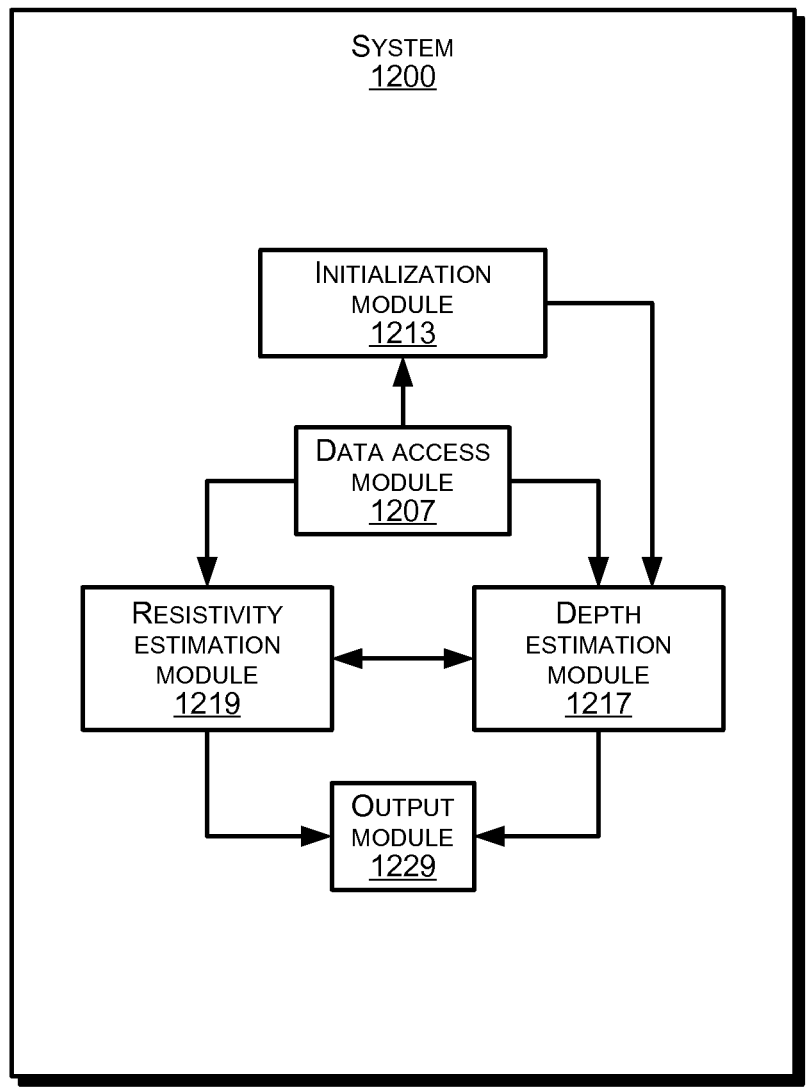
FIG. 12 is a schematic block diagram of a system for estimating subsurface formation and invasion properties, according to an example embodiment.

FIG. 12 is a schematic block diagram of an example system 1200 for estimating subsurface formation and invasion properties, according to an example embodiment. The example system 1200 of FIG. 12 may be configured to perform one or more of the methods described above with reference to FIGS. 10 and 11. The system 1200 may comprise multiple hardware-implemented modules for performing the respective operations described previously.

In this example embodiment, the system 1200 includes a data access module 1207 configured to access measurement data indicative of depth-variant resistivity characteristics of a subsurface measurement zone (see, e.g., FIG. 7). The measurement data may comprise log data collected by a multi-array laterolog tool such as the example tool 502 described with reference to FIG. 5. As before, the subsurface measurement zone may comprise a geological formation 118 and an invasion zone 707 that extends radially from a borehole 116 into the geological formation for an unknown invasion depth (L), with the measurement data comprising a plurality of measurements indicative of resistivity values for the subsurface measurement zone (i.e., composite resistivity values for the formation and the invasion zone combined) at different respective radial depths.

The system 1200 further comprises a depth estimation module 1217 configured to calculate an estimated value for the invasion depth based at least in part on the access measurement data. The depth estimation module 1217 is in this embodiment configured to calculate the estimated value for the invasion depth by iterative solution of a one-dimensional optimization problem in which the invasion depth is the sole variable measurement zone parameter. In this example embodiment, the depth estimation module 1217 is configured to estimate the invasion depth by use of Equation (2).

The depth estimation module 1217 is configured for cooperation with an initialization module 1213 configured to estimate, before calculation of the estimated value for the invasion depth by the depth estimation module 1217, (a) an initial guessed value for resistivity of the geological formation and (b) an initial guessed value for resistivity of the invasion zone. In this example embodiment, the initialization module 1213 is configured to automatically calculate the estimated initial values according to the earlier described relationships $R_{xo}^{guess} = 1/\sigma_m^1$, and $R_t^{guess} = \sigma_m^N$. The depth estimation module 1217 is configured to use these estimated initial values as fixed input parameters for performance of the one-dimensional optimization problem.

The system 1200 further comprises a resistivity estimation module 1219 to calculate estimated resistivity values for the formation and the invasion zone respectively. In this example embodiment, the resistivity estimation module 1219 is configured to perform the resistivity estimation by solving a three-dimensional optimization problem having the formation resistivity, the invasion zone resistivity, and the invasion depth as variable subsurface measurement zone parameters, here being performed by use of Equation (1). Instead, or in addition, the resistivity estimation module 1219 may be configured to estimate the formation resistivity and the invasion zone resistivity by solving a two-dimensional optimization problem, e.g., according to Equation (3), using the previously calculated estimated invasion depth value as a fixed input parameter.

The system 1200 further comprises an output module 1229 configured to deliver the estimated measurement zone parameters. The output module 1229 may in some embodiments deliver numerical tables with estimated values for the invasion depth, formation resistivity, and invasion resistivity at multiple different points along the borehole 116. In other embodiments, a graphical plot that maps the estimated values to the borehole positions may be printed in hard copy, and/or may be displayed on a display screen.

Modules, Components, and Logic

Certain embodiments are described herein as including logic or a number of components, modules, or mechanisms. Modules may constitute either software modules, with code embodied on a non-transitory machine-readable medium (i.e., such as any conventional storage device, such as volatile or non-volatile memory, disk drives or solid state storage devices (SSDs), etc.), or hardware-implemented modules. A hardware-implemented module is a tangible unit capable of performing certain operations and may be configured or arranged in a certain manner. In example embodiments, one or more computer systems (e.g., a standalone, client, or server computer system) or one or more processors may be configured by software (e.g., an application or application portion) as a hardware-implemented module that operates to perform certain operations as described herein.

In various embodiments, a hardware-implemented module may be implemented mechanically or electronically. For example, a hardware-implemented module may comprise dedicated circuitry or logic that is permanently configured (e.g., as a special-purpose processor, such as a field programmable gate array (FPGA) or an application-specific integrated circuit (ASIC)) to perform certain operations. A hardware-implemented module may also comprise programmable logic or circuitry (e.g., as encompassed within a general-purpose processor or other programmable processor) that is temporarily configured by software to perform certain operations. It will be appreciated that the decision to implement a hardware-implemented module mechanically, in dedicated and permanently configured circuitry or in temporarily configured circuitry (e.g., configured by software), may be driven by cost and time considerations.

Accordingly, the term "hardware-implemented module" should be understood to encompass a tangible entity, be that an entity that is physically constructed, permanently configured (e.g., hardwired), or temporarily or transitorily configured (e.g., programmed) to operate in a certain manner and/or to perform certain operations described herein. Considering embodiments in which hardware-implemented modules are temporarily configured (e.g., programmed), each of the hardware-implemented modules need not be configured or instantiated at any one instance in time. For example, where the hardware-implemented modules comprise a general-purpose processor configured using software, the general-purpose processor may be configured as respective different hardware-implemented modules at different times. Software may accordingly configure a processor, for example, to constitute a particular hardware-implemented module at one instance of time and to constitute a different hardware-implemented module at a different instance of time.

Hardware-implemented modules can provide information to, and receive information from, other hardware-implemented modules. Accordingly, the described hardware-implemented modules may be regarded as being communicatively coupled. Where multiple of such hardware-implemented modules exist contemporaneously, communications may be achieved through signal transmission (e.g., over appropriate circuits and buses) that connect the hardware-implemented modules. In embodiments in which multiple hardware-implemented modules are configured or instantiated at different times, communications between such hardware-implemented modules may be achieved, for example, through the storage and retrieval of information in memory structures to which the multiple hardware-implemented modules have access. For example, one hardware-implemented module may perform an operation and store the output of that operation in a memory device to which it is communicatively coupled. A further hardware-implemented module may then, at a later time, access the memory device to retrieve and process the stored output. Hardware-implemented modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., Application Program Interfaces (APIs).)

Figure 13:
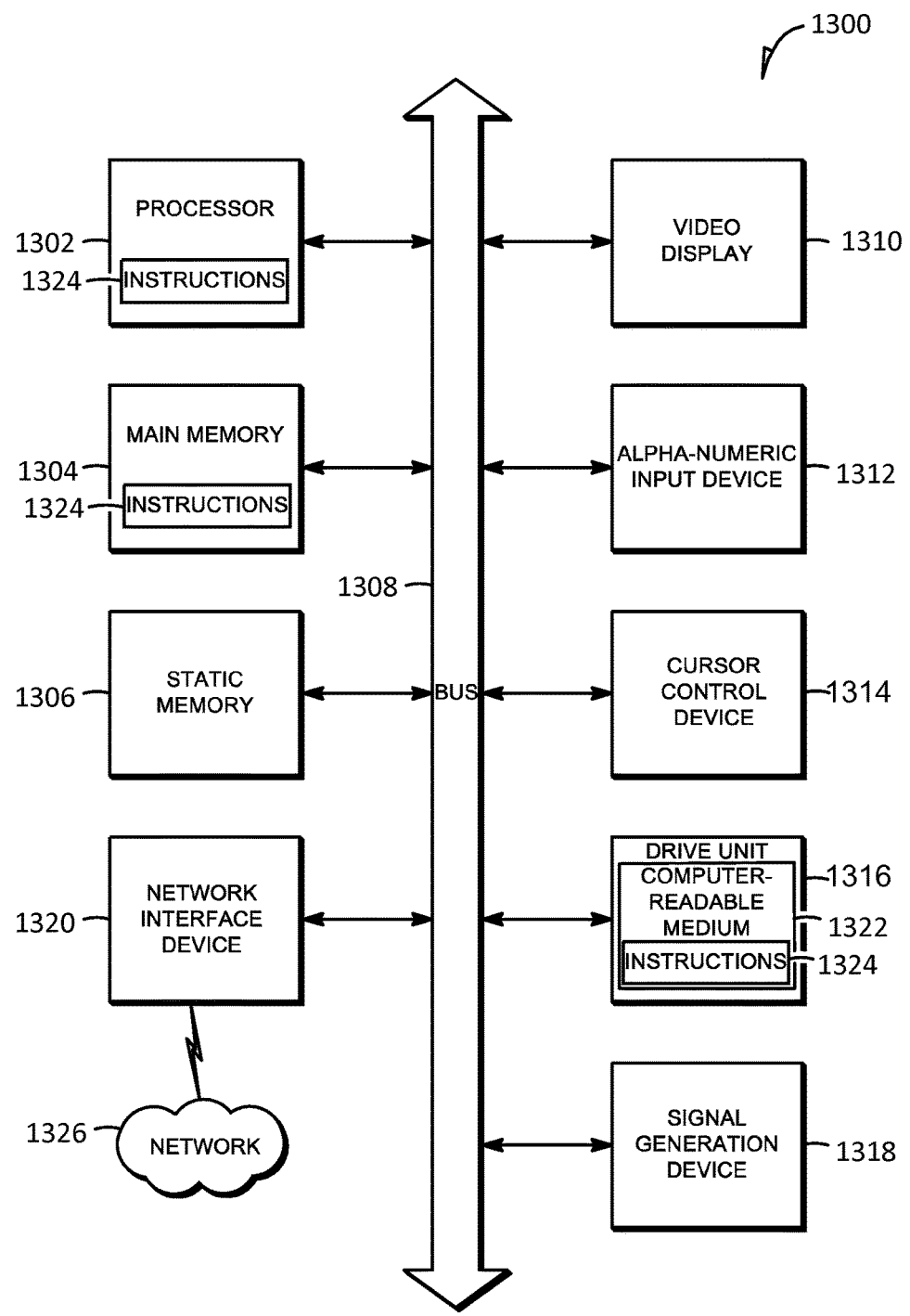
FIG. 13 is a diagrammatic representation of machine in the example form of a computer system within which a set of instructions for causing the machine to perform a method for estimating subsurface formation and invasion properties may be executed.

FIG. 13 shows a diagrammatic representation of a machine in the example form of a computer system 1300 within which a set of instructions 1324 may be executed for causing the machine to perform any one or more of the methodologies discussed herein. For example, the surface computer system 366 (FIG. 3) or any one or more of its components may be provided by the system 1300.

In alternative embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a server computer, a client computer, a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1300 includes a processor 1302 (e.g., a central processing unit (CPU) a graphics processing unit (GPU) or both), a main memory 1304 and a static memory 1306, which communicate with each other via a bus 1308. The computer system 1300 may further include a video display unit 1310 (e.g., a liquid crystal display (LCD) or a cathode ray tube (CRT)). The computer system 1300 also includes an alpha-numeric input device 1312 (e.g., a keyboard), a cursor control device 1314 (e.g., a mouse), a disk drive unit 1316, a signal generation device 1318 (e.g., a microphone/speaker) and a network interface device 1320.

The disk drive unit 1316 includes a machine-readable or computer-readable storage medium 1322 on which is stored one or more sets of instructions 1324 (e.g., software) embodying any one or more of the methodologies or functions described herein. The instructions 1324 may also reside, completely or at least partially, within the main memory 1304 and/or within the processor 1302 during execution thereof by the computer system 1300, the main memory 1304 and the processor 1302 also constituting non-transitory machine-readable media. The instructions 1324 may further be transmitted or received over a network 1326 via the network interface device 1320.

While the machine-readable storage medium 1322 is shown in an example embodiment to be a single medium, the term "machine-readable medium" should be taken to include a single medium or multiple media (e.g., a centralized or distributed database and/or associated caches and servers) that store the one or more sets of instructions 1324. The term "machine-readable medium" shall also be taken to include any medium that is capable of storing a set of instructions for execution by the machine and that cause the machine to perform any one or more of the methodologies of this disclosure. The term "machine-readable medium" shall accordingly be taken to include, but not be limited to, solid-state memory devices of all types, as well as optical and magnetic media.

It will be seen from the above-described example embodiments that the disclosure includes a method and system for estimating invasion and formation characteristics, the system comprising:

a data access module configured to access measurement data indicative of depth-variant resistivity characteristics of a subsurface measurement zone radially adjacent a borehole, the subsurface measurement zone comprising a geological formation and an invasion zone that extends radially from the borehole into the geological formation for an unknown invasion depth, the measurement data comprising a plurality of measurements indicative of resistivity values for the subsurface measurement zone at different respective radial depths; and a depth estimation module configured to calculate an estimated value for the invasion depth based at least in part on the measurement data and using one or more computer processors, calculation of the estimated value for the invasion depth comprising iterative solution of a one-dimensional optimization problem, the invasion depth being a sole variable measurement zone parameter of the optimization problem.

A method for estimating invasion and formation characteristics may comprise performance of the above-defined operations performed by the data access module in the depth estimation module respectively. The one-dimensional optimization problem may be based at least in part on non-variable components comprising an initial guessed value for resistivity of the geological formation and an initial guessed value for resistivity of the invasion zone. These initial guessed values may thus comprise fixed input parameters for the one-dimensional optimization problem. Note that the one-dimensional optimization problem may be performed prior to any minimization operation or optimization operation for estimating values for formation resistivity and invasion resistivity.

The measurements data may comprise data captured by a multi-array laterolog tool, with each of the plurality of measurements corresponding to a respective one of a series of measurement arrays of the multi-array laterolog tool. The method may include estimating, before calculation of the estimated value for the invasion depth: an initial guessed value for resistivity of the geological formation based on a measurement corresponding to a particular measurement array that indicates measurement zone resistivity at a greatest radial depth for the series of measurement arrays; and an initial guessed value for resistivity of the invasion zone based on a measurement corresponding to a first measurement array that indicates measurement zone resistivity at a smallest radial depth of the series of measurement arrays. The estimated value for the invasion depth may be calculated based at least in part on the initial guessed values for the resistivity of the invasion zone and the geological formation respectively. The system may include an initialization module for estimating the initial guessed values for geological formation resistivity and invasion resistivity.

The one-dimensional optimization problem may be based on differences between measurements corresponding to respective measurement arrays of the multi-array laterolog tool. In some embodiments, the one-dimensional optimization problem may be based on differences between respective measurements of neighboring measurement arrays of the multi-array laterolog tool. In such cases, the one-dimensional optimization problem may be based on normalized differences between respective measurements of neighboring measurement arrays of the multi-array laterolog tool. Each normalized difference may comprise a difference between respective measurements for a neighboring pair of the series of measurement arrays, divided by a difference between respective measurements spanning a greater interval of the series of measurement arrays. In particular, the differences between the measurements of neighboring arrays may be normalized through division by a first measurement array (corresponding to a smallest depth of investigation) and a last measurement array (corresponding to a greatest depth of investigation) in the series of measurement arrays.

The one-dimensional optimization problem may be a function to minimize a misfit error between (a) the normalized differences between respective measurements of neighboring measurement arrays of the multi-array laterolog tool, and (b) normalized differences between respective predicted measurement values for neighboring measurement arrays, the predicted measurement values being based on a simulated measurement zone model based on the invasion depth as the sole variable measurement zone parameter.

The method may further comprise performing a three-dimensional optimization procedure, using the estimated value for the invasion depth as an input, to calculate (a) a refined value for the invasion depth, (b) an estimated value for resistivity of the invasion zone, and (c) an estimated value for resistivity of the geological formation. In other embodiments, the method instead comprises performing a two-dimensional optimization procedure, using the estimated value for the invasion depth as a fixed input parameter, to calculate (a) an estimated value for resistivity of the invasion zone, and (b) an estimated value for resistivity of the geological formation. The system may comprise a resistivity estimation module for performing the two-dimensional optimization procedure or the three-dimensional optimization procedure in an automated operation using one or more processors.

Although this disclosure has been described with reference to specific example embodiments, it will be evident that various modifications and changes may be made to these embodiments without departing from the broader scope of the disclosure. Accordingly, the specification and drawings are to be regarded in an illustrative rather than a restrictive sense.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method comprising:
   generating a current from an electrode on a tool body of a multi-array laterolog tool, wherein the multi-array laterolog tool comprises neighboring arrays, wherein the neighboring arrays are axially spaced along the tool body, and wherein the neighboring arrays comprise a first array, one or more middle arrays, and a last array, and wherein the one or more middle arrays are positioned axially between the first array and the last array;
   receiving measurement values from the multi-array laterolog tool, wherein each of the measurement values corresponds with one of the neighboring arrays and is indicative of resistivity;
   determining an estimated invasion resistivity and an estimated formation resistivity;
   generating normalized differences (i) between the measurement values corresponding to the neighboring arrays and (ii) simulated log values corresponding to the neighboring arrays, the normalized differences based, at least in part, on a difference between measurement values of the first array and the last array and a difference between simulated log values corresponding to the first array and the last array, wherein the simulated log values are based on the estimated invasion resistivity and the estimated formation resistivity; and
   determining an initial invasion depth based, at least in part, on the normalized differences.

2. The method of claim 1, wherein at least one of the estimated invasion resistivity and the estimated formation resistivity is an inaccurate estimate.

3. The method of claim 2, wherein determining the estimated invasion resistivity and the estimated formation resistivity comprises reading a predefined invasion resistivity value and a predefined formation resistivity value.

4. The method of claim 1, wherein generating the normalized differences comprises:
   for each set of the neighboring arrays,
      determining a first ratio of a difference between measurement values of the set of the neighboring arrays and the difference between measurement values of the first array and the last array of the multi-array laterolog tool;
      determining a second ratio of a difference between simulated log values corresponding to the set of the neighboring arrays and the difference between simulated log values corresponding to the first array and the last array; and
      computing a difference between the first ratio and the second ratio.

5. The method of claim 4, further comprising determining squares by computing a square of the difference between the first ratio and the second ratio for each set of neighboring arrays, wherein determining the initial invasion depth comprises computing a sum of the squares.

6. The method of claim 5, wherein computing the sum of the squares comprises computing a sum of weighted squares, wherein each square is modified by a weight associated with neighboring arrays corresponding to the square.

7. The method of claim 1, wherein generating the normalized differences and determining the initial invasion depth are in accordance with $$f(L) = \sum_{i=1}^{N-1} w_i \left| \frac{\sigma_m^{i+1} - \sigma_m^i}{\sigma_m^N - \sigma_m^1} - \frac{S^{i+1}(R_{xo} = R_{xo}^{guess}, R_t = R_t^{guess}, L) - S^i(R_{xo} = R_{xo}^{guess}, R_t = R_t^{guess}, L)}{S^N(R_{xo} = R_{xo}^{guess}, R_t = R_t^{guess}, L) - S^1(R_{xo} = R_{xo}^{guess}, R_t = R_t^{guess}, L)} \right|^2,$$

wherein, for each i-th array, L represents the initial invasion depth, N represents a total number of the neighboring arrays, $w_i$ represents a weighting factor of the i-th array, $\sigma_m^i$ represents a measurement value of the i-th array, $R_{xo}$ represents invasion resistivity, $R_t$ representation formation resistivity, $R_{xo}^{guess}$ represents the estimated invasion resistivity, $R_t^{guess}$ represents the estimated formation resistivity, $S^i$ represents a simulated log corresponding to the i-th array, and $S^i(R_{xo}=R_{xo}^{guess}, R_t=R_t^{guess}, L)$ represents a simulated log value corresponding to the i-th array and corresponding to the estimated invasion resistivity and to the estimated formation resistivity.

8. The method of claim 1, wherein the estimated invasion resistivity and the estimated formation resistivity are non-variable estimates.

9. The method of claim 1, wherein determining the estimated invasion resistivity and the estimated formation resistivity comprises determining the estimated invasion resistivity as an inverse of a measurement value of the first array and determining the estimated formation resistivity as an inverse of a measurement value of the last array.

10. The method of claim 1 further comprising:
   determining a second estimated invasion resistivity and a second estimated formation resistivity with a two-dimensional minimization problem that initially uses the initial invasion depth as a non-variable component of the two-dimensional minimization problem;
   determining whether convergence is achieved for invasion resistivity, formation resistivity, and invasion depth;
   based on a determination that convergence is achieved, supplying the converged invasion resistivity, formation resistivity, and invasion depth for an estimated image of formation characteristics surrounding a borehole from which the multi-array laterolog tool obtained the measurement values; and based on a determination that convergence was not achieved, normalizing differences between the measurement values and simulated log values corresponding to the neighboring arrays again to generate revised normalized differences, wherein the simulated log values are based on the second estimated invasion resistivity and the second estimated formation resistivity; and determining a revised invasion depth based on the revised normalized differences.

11. The method of claim 10, wherein the two-dimensional minimization problem is expressed as $$f(R_{xo}, R_t) = \sum_{i=1}^{N} w_i |\sigma_m^i - S^i(R_{xo}, R_t, L = L^{est})|^2$$

wherein, for each i-th array, L represents the invasion depth, $L^{est}$ represents the initial invasion depth, N represents a total number of the neighboring arrays, $w_i$ represents a weighting factor of the i-th array, $\sigma_m^i$ represents a measurement value of the i-th array, $R_{xo}$ represents invasion resistivity, $R_t$ representation formation resistivity, $S^i$ represents a simulated log corresponding to the i-th array, and $S^i(R_{xo}, R_t, L=L^{est})$ represents a simulated log value corresponding to the i-th array and corresponding to the initial invasion depth.

12. The method of claim 1 further comprising:

determining invasion resistivity, formation resistivity, and invasion depth with a three-dimensional minimization problem that initially uses the initial invasion depth as a variable component of the three-dimensional minimization problem; and supplying the invasion resistivity, formation resistivity, and invasion depth for an estimated image of formation characteristics surrounding a borehole from which the multi-array laterolog tool obtained the measurement values.

13. The method of claim 1, further comprising using at least one of the estimated invasion resistivity, estimated formation resistivity, and initial invasion depth to determine at least one characteristic of a borehole or a formation.

14. The method of claim 13, wherein the characteristic is at least one of a permeability, a porosity, and a hydrocarbon saturation.

15. The method of claim 1, wherein determining the initial invasion depth comprises determining the initial invasion depth based, at least in part, on minimization of a difference between the normalized differences.

16. One or more non-transitory machine-readable media comprising program instructions for efficient estimation of subsurface formation parameters, the program instructions to:

generate a current from an electrode on a tool body of a multi-array laterolog tool, wherein the multi-array laterolog tool comprises neighboring arrays, wherein the neighboring arrays are axially spaced along the tool body, and wherein the neighboring arrays comprise a first array, one or more middle arrays, and a last array, and wherein the one or more middle arrays are positioned axially between the first array and the last array;

receive measurement values from the multi-array laterolog tool, wherein each of the measurement values corresponds with one of the neighboring arrays and is indicative of resistivity;

determine an estimated invasion resistivity and an estimated formation resistivity;

generate normalized differences (i) between the measurement values corresponding to the neighboring arrays and (ii) simulated log values corresponding to the neighboring arrays, the normalized differences based, at least in part, on differences between measurement values of the first array and the last array and differences between simulated log values corresponding to the first array and the last array, wherein the simulated log values are based on the estimated invasion resistivity and the estimated formation resistivity; and determine an initial invasion depth based, at least in part, on the normalized differences.

17. The one or more non-transitory machine-readable media of claim 16, wherein at least one of the estimated invasion resistivity and the estimated formation resistivity is an inaccurate estimate.

18. The one or more non-transitory machine-readable media of claim 16, wherein the program instructions to normalize and estimate are in accordance with the expression $$f(L) = \sum_{i=1}^{N-1} w_i \left| \frac{\sigma_m^{i+1} - \sigma_m^i}{\sigma_m^N - \sigma_m^1} - \frac{S^{i+1}(R_{xo} = R_{xo}^{guess}, R_t = R_t^{guess}, L) - S^i(R_{xo} = R_{xo}^{guess}, R_t = R_t^{guess}, L)}{S^N(R_{xo} = R_{xo}^{guess}, R_t = R_t^{guess}, L) - S^1(R_{xo} = R_{xo}^{guess}, R_t = R_t^{guess}, L)} \right|^2 ,$$

wherein, for each i-th array, L represents the initial invasion depth, N represents a total number of the neighboring arrays, $w_i$ represents a weighting factor of the i-th array, $\sigma_m^i$ represents a measurement value of the i-th array, $R_{xo}$ represents invasion resistivity, $R_t$ representation formation resistivity, $R_{xo}^{guess}$ represents the estimated $S^i$ invasion resistivity, $R_t^{guess}$ represents the estimated formation resistivity, $S^i$ represents a simulated log corresponding to the i-th array, and $S^i(R_{xo}=R_{xo}^{guess}, R_t=R_t^{guess}, L)$ represents a simulated log value corresponding to the i-th array and corresponding to the estimated invasion resistivity and to the estimated formation resistivity.

19. The one or more non-transitory machine-readable media of claim 16, further comprising program instructions to:

determine a second estimated invasion resistivity and a second estimated formation resistivity with a two-dimensional minimization problem that initially uses the initial invasion depth as a non-variable component of the two-dimensional minimization problem;

determine whether convergence is achieved for invasion resistivity, formation resistivity, and invasion depth;

based on a determination that convergence is achieved, supply the converged invasion resistivity, formation resistivity, and invasion depth for an estimated image of formation characteristics surrounding a borehole from which the multi-array laterolog tool obtained the measurement values; and based on a determination that convergence was not achieved,
normalize differences between the measurement values and simulated log values corresponding to the neighboring arrays again to generate revised normalized differences, wherein the simulated log values are based on the second estimated invasion resistivity and the second estimated formation resistivity; and
determine a revised invasion depth based on the revised normalized differences.

20. The one or more non-transitory machine-readable media of claim 19, wherein the two-dimensional minimization problem is expressed as $$f(R_{xo}, R_t) = \sum_{i=1}^{N} w_i |\sigma_m^i - S^i(R_{xo}, R_t, L = L^{est})|^2$$

wherein, for each i-th array, L represents the invasion depth, $L^{est}$ represents the initial invasion depth, N represents a total number of the neighboring arrays, $w_i$ represents a weighting factor of the i-th array, $\sigma_m^i$ represents a measurement value of the i-th array, $R_{xo}$ represents invasion resistivity, $R_t$ representation formation resistivity, $S^i$ represents a simulated log corresponding to the i-th array, and $S^i(R_{xo}, R_t, L=L^{est})$ represents a simulated log value corresponding to the i-th array and corresponding to the initial invasion depth.

21. The one or more non-transitory machine-readable media of claim 16, further comprising program instructions to:
determine invasion resistivity, formation resistivity, and invasion depth with a three-dimensional minimization problem that initially uses the initial invasion depth as a variable component of the three-dimensional minimization problem; and
supply the invasion resistivity, formation resistivity, and invasion depth for an estimated image of formation characteristics surrounding a borehole from which the multi-array laterolog tool obtained the measurement values.

22. The one or more non-transitory machine-readable media of claim 16, further comprising program instructions to use at least one of the estimated invasion resistivity, estimated formation resistivity, and initial invasion depth to determine at least one characteristic of a borehole or a formation.

23. The one or more non-transitory machine-readable media of claim 22, wherein the characteristic is at least one of a permeability, a porosity, and a hydrocarbon saturation.

24. An apparatus comprising:
a multi-array laterolog tool comprising:
a tool body,
an electrode on the tool body,
neighboring arrays, wherein the neighboring arrays are axially spaced along the tool body, and wherein the neighboring arrays comprise a first array, one or more middle arrays, and a last array, and wherein the one or more middle arrays are positioned axially between the first array and the last array;
a processor; and
a machine-readable medium comprising program instructions executable by the processor to cause the apparatus to,
generate a current from the electrode;
receive measurement values from the multi-array laterolog tool, wherein each of the measurement values corresponds with one of the neighboring arrays and is indicative of resistivity;
determine an estimated invasion resistivity and an estimated formation resistivity;
generate normalized differences (i) between the measurement values corresponding to the neighboring arrays and (ii) simulated log values corresponding to the neighboring arrays, the normalized differences based, at least in part, on differences between measurement values of the first array and the last array and differences between simulated log values corresponding to the first array and the last array, wherein the simulated log values are based on the estimated invasion resistivity and the estimated formation resistivity; and
determine an initial invasion depth based, at least in part, on the normalized differences.

25. The apparatus of claim 24, wherein the machine-readable medium further comprises program instructions executable by the processor to cause the apparatus to:
determine a second estimated invasion resistivity and a second estimated formation resistivity with a two-dimensional minimization problem that initially uses the initial invasion depth as a non-variable component of the two-dimensional minimization problem;
determine whether convergence is achieved for invasion resistivity, formation resistivity, and invasion depth;
based on a determination that convergence is achieved, supply the converged invasion resistivity, formation resistivity, and invasion depth for an estimated image of formation characteristics surrounding a borehole from which the multi-array laterolog tool obtained the measurement values; and
based on a determination that convergence was not achieved,
normalize differences between the measurement values and simulated log values corresponding to the neighboring arrays again to generate revised normalized differences, wherein the simulated log values are based on the second estimated invasion resistivity and the second estimated formation resistivity; and
determine a revised invasion depth based on the revised normalized differences.

26. The apparatus of claim 24, wherein the machine-readable medium further comprises program instructions executable by the processor to cause the apparatus to use at least one of the estimated invasion resistivity, estimated formation resistivity, and initial invasion depth to determine at least one characteristic of a borehole or a formation.

27. The apparatus of claim 26, wherein the characteristic is at least one of a permeability, a porosity, and a hydrocarbon saturation.

28. The apparatus of claim 24, wherein the electrode comprises one of a plurality of electrodes along the tool body, wherein the neighboring arrays are interspersed between the plurality of electrodes.

* * * * *